(12) United States Patent
Lum et al.

(10) Patent No.: US 7,214,562 B2
(45) Date of Patent: May 8, 2007

(54) METHOD FOR ENCAPSULATING LEAD FRAME PACKAGES

(75) Inventors: Richard Yee Mow Lum, Perak (MY); Wong Chee Heng, Perak (MY); Lau Kam Chuan, Perak (MY); Goh Kok Siang, Perak (MY); Yip Chee Sang, Perak (MY)

(73) Assignee: Carsem (M) Sdn. Bhd. (MY)

( * ) Notice: Subject to any disclaimer, the term of this patent is extended or adjusted under 35 U.S.C. 154(b) by 90 days.

(21) Appl. No.: 11/067,300

(22) Filed: Feb. 25, 2005

(65) Prior Publication Data

US 2005/0287715 A1 Dec. 29, 2005

(30) Foreign Application Priority Data

Feb. 25, 2004 (MY) .............................. PI 20040629

(51) Int. Cl.
H01L 21/44 (2006.01)
H01L 21/48 (2006.01)
H01L 21/50 (2006.01)

(52) U.S. Cl. ...................... 438/106; 438/111; 438/123; 438/127; 257/E21.499; 257/E21.502; 257/E21.503

(58) Field of Classification Search ................ 438/106, 438/107, 108, 109, 110, 111, 112, 123, 124, 438/126, 127
See application file for complete search history.

(56) References Cited

U.S. PATENT DOCUMENTS 4,460,537 A 7/1984 Heinle
5,105,259 A * 4/1992 McShane et al. ........... 257/667
5,197,183 A * 3/1993 Chia et al. .................... 29/827
5,652,185 A * 7/1997 Lee ............................. 438/113
5,691,241 A * 11/1997 Kazutaka ..................... 438/111
6,432,749 B1 * 8/2002 Libres ......................... 438/122
6,521,484 B1 2/2003 Hsieh
6,674,165 B2 * 1/2004 Ho et al. ..................... 257/730
2002/0105063 A1 8/2002 Huat et al.

* cited by examiner

*Primary Examiner*—David Nhu
(74) *Attorney, Agent, or Firm*—Townsend and Townsend and Crew LLP

(57) ABSTRACT

A method of encapsulating a plurality of IC chips attached to a lead frame strip that includes an outer frame and a plurality of vertical and horizontal connecting bars attached to the outer frame in a manner that defines a plurality of inner frames arranged in a matrix pattern within the outer frame, each inner frame including an area where an IC chip from the plurality of IC chips is attached. The method comprises, for each inner frame, encasing the IC chip attached to the inner frame along with a portion of the inner frame within a package cavity of a mold sized to form a single integrated circuit package; and injecting encapsulant material into each package cavity, where the encapsulant material is delivered to the package cavity through a series of runners and gates that includes at least one runner positioned on a plane above the lead frame strip, a lead frame runner positioned along a first connecting bar of the lead frame strip and a vertical gate that couples a runner positioned on a plane above the lead frame strip to the lead frame runner and wherein each lead frame runner delivers encapsulant material to a plurality of package cavities positioned adjacent to the lead frame runner.

21 Claims, 7 Drawing Sheets

METHOD FOR ENCAPSULATING LEAD FRAME PACKAGES

BACKGROUND OF THE INVENTION

1. Field of the Invention

The present invention relates generally to a method for encapsulating lead frame based packages. More specifically, embodiments of the invention pertain to a high density molded lead frame and a method for manufacturing the same.

2. Background Art

Recently developed packages for integrated circuit (IC) die or chips include the quad flat, no-lead (QFN) package and the dual flat, no-lead (DFN) package, which is essentially the same as a QFN package except it includes leads on two sides of the package instead of four. QFN and DFN packages are sometimes referred to within the semiconductor industry as micro lead frame (MLF) packages or a molded leadframe packages (MLP). FIG. 1 is a cross-sectional view of a simplified MLP 10. MLP 10 includes an IC die 12 attached to a die pad portion 14 of a lead frame by an adhesive 13. Bonding pads 18 are formed on the top of IC die 12 and connected to leads 16 of the leadframe by wirebonds 19. An encapsulant material 20 covers the package including IC die 12, wirebonds 19 and the upper surfaces of die pad 14 and leads 16. Die pad 14 and leads 16 are exposed on the bottom of the package thereby facilitating heat dissipation from IC 12 external to package 10 and decreasing the overall thickness of the package. A half-etched portion 17 is formed on the sidewall surface of die pad 14 and leads 16 to better mechanically secure the die pad and leads to the encapsulant material, which flows underneath half-etched portion 17.

MLP 10 is typically one of many IC packages formed in a matrix pattern on a lead frame strip, and MLP 10 is typically encapsulated using one of two different techniques, which can be referred to as block molding or matrix molding. Packages encapsulated using a block molding technique are typically separated from the lead frame strip using a sawing process while packages encapsulated using a matrix molding technique are typically separated from the lead frame using a punch process. To accommodate the different types of encapsulation and singulation processes, lead frame strips are specifically designed for one or the other.

One example of a suitable lead frame strip 30 that can be used for a block encapsulation process is shown in FIG. 2. Strip 30 includes an outer frame 32 having a plurality of positioning holes 34 formed thereon and a plurality of vertical and horizontal connecting bars 36 and 38, respectively, that form a plurality of inner frames 40 which are shown in more detail in FIG. 3, which is an expanded view of portion A in FIG. 2. Each inner frame 40 shown in FIG. 3 includes a die pad 14 and a plurality of leads 16 that surround the die pad. Die pad 14 is connected to the lead frame by tie bars, which are not shown for simplicity, and each set of leads 16 extends from one of the horizontal or vertical connecting bars towards its respective die pad 14.

Lead frame strip 30 includes four 9×9 matrices of inner frames 40, each of which will be made into an IC package to provide 81 separate IC packages per block. In a block encapsulation method, each matrix is encapsulated within a single block of encapsulation material and then singulated using a sawn technique. FIG. 4 shows a lead frame strip 30 having two encapsulation blocks 31a and 31b formed over matrices of IC packages within the area covered by blocks 31a and 31b. Also shown in FIG. 4 are two 9×9 matrices (31c and 31d) of inner frames 40 that have not yet been covered by encapsulation blocks. Each of blocks 31a–31d provides 81 separate IC packages after the encapsulation, singulation and additional steps of the package formation process are completed. A plurality of stress relief holes 42 are shown between each of blocks 31a–31d that help ensure accurate singulation during the sawing process.

An example of a lead frame 50 suitable for a matrix type molding process is shown in FIGS. 5 and 6. A matrix mold encapsulation process encapsulates each integrated circuit package within a separate cavity as opposed to using a single cavity to encapsulate an entire matrix as done in a block molding method. Matrix molding techniques are typically used when packages are separated from the lead frame strip using a punch singulation technique as opposed to a sawing technique. FIG. 5 shows an example of a portion of a lead frame strip 50 that can be used for a matrix molding encapsulation technique where each individual IC package is encased within a package cavity 54 of a mold. As shown in FIG. 5, space needs to be saved on the lead frame strip for runners 52 to be placed between the individual IC packages. During a standard transfer molding encapsulation process, encapsulant is melted and flows down the runners by the force of gravity. From the runners, the encapsulant then flows into gates 53 that lead to a cavity 54, which defines the shape of the plastic resin that makes up the bulk of each IC package. The encapsulant fills the cavity within the mold and, after the encapsulant cools and hardens, the mold can be removed leaving behind a partially formed package having encapsulant material covering the IC chip, wire bonds and leads (except for the portion used to make contact to an external device/board).

One problem with the well known transfer molding process described with respect to FIG. 5 is that providing space for the runners reduces the density of the packages that can be formed for a given size lead frame strip thus contributing to an overall cost increase in the MLP manufacturing process. Each runner 52 travels the length of the connecting bar it is positioned over and thus needs to be wide enough to allow for a sufficient amount of encapsulant to travel down the runner and fill the mold cavity for each package connected to the runner in a reasonable amount of time. This issue can be easily seen in FIG. 6, which is a simplified top plan view of the lead frame strip 50 that was only partially shown in FIG. 5. As shown in FIG. 6, lead frame strip 50 includes alternating thin vertical connecting bars 55 and thicker vertical connecting bars 56. Runners 52 are positioned over the thicker vertical connecting bars 56 (note FIG. 5 is rotated 90 degrees with respect to FIG. 6). The runner along connecting bar 56a provides encapsulant to the eighteen cavities in lead frame strip 50 adjacent to connecting bar 56a (shown within dashed line B, note that lead frame strip 50 has columns of packages nine rows deep).

Accordingly, improved techniques and method of packaging ICs, such as MLPs 10, are desirable.

BRIEF SUMMARY OF THE INVENTION

Embodiments of the invention provide for new and improved techniques of encapsulating IC packages. While the technique of the present invention is particularly useful in the packaging of MLP or similar QFN and DFN packages, embodiments of the invention can also be used to package other types of chip scale packages and can be used to create packages in which encapsulant covers both the lower and upper surfaces of the die pad and/or leads.

Embodiments of the invention can be used in matrix type encapsulation processes in which hundreds of IC packages are formed from a single lead frame strip that includes an outer frame and a plurality of vertical and horizontal connecting bars attached to the outer frame. The vertical and horizontal connecting bars define a plurality of inner frames arranged in a matrix pattern within the outer frame. Each inner frame includes an area where an IC chip is attached. In some embodiments, each inner frame includes a die pad and a plurality of leads that extend towards the die pad from one or more connecting bars. In other embodiments, used for chip-on-lead (COL) type packages, the inner frame does not include a die pad and the IC chip is attached directly to inner ends of the leads that project inward from the connecting bars.

According to one embodiment, a method of encapsulating a plurality of IC chips attached to a lead frame strip comprises, for each inner frame, encasing the IC chip attached to the inner frame along with a portion of the inner frame within a package cavity of a mold sized to form a single integrated circuit package and injecting encapsulant material into each package cavity. The encapsulant material is delivered to the package cavity through a series of runners and gates that includes at least one runner positioned on a plane above the package cavities, a lead frame runner positioned along a first connecting bar of the lead frame strip and a vertical gate that couples a runner positioned on a plane above the lead frame strip to the lead frame runner and each lead frame runner delivers encapsulant material to a plurality of package cavities positioned adjacent to the lead frame runner.

According to another embodiment, a method of forming a plurality of integrated circuit packages on a lead frame strip comprising a plurality of inner frames arranged in a matrix pattern within an outer frame, each inner frame having a die pad and a plurality of leads arranged around the die pad is provided. The method comprises, for each of a first plurality of integrated circuit die, attaching an integrated circuit die in the first plurality of integrated circuit die to a unique die pad and electrically connecting the integrated circuit die to at least some of the plurality of leads surrounding its respective die pad. Each attached integrated circuit die is encased, along with at least a portion of the lead frame, within a cavity of a mold sized to form a single integrated circuit package. The mold includes an inlet positioned between adjacent leads associated with the integrated circuit die through which encapsulating material can be introduced into the cavity. Encapsulant material is then injected into each cavity under pressure to encapsulate the integrated circuit die. During the injecting process, the encapsulant material flows through a runner positioned on a plane through a vertical gate to a lead frame runner positioned along a connecting bar of lead frame strip and into a plurality of mold cavities through a respective plurality of cavity gates coupled to the lead frame runner. After the encapsulant material hardens, the plurality of integrated circuit packages is singulated using a punch singulation technique.

These and other embodiments of the present invention, as well its advantages and features, are described in more detail in conjunction with the description below and attached figures.

DETAILED DESCRIPTION OF THE INVENTION

Figure 6:
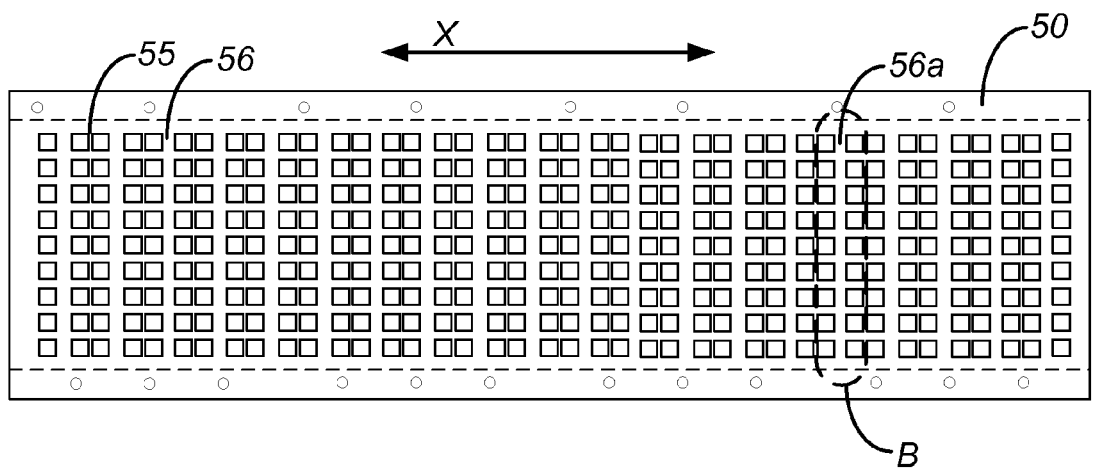
FIG. 6 is a simplified top plan view of lead frame strip 50 shown in FIG. 5.
Figure 7:
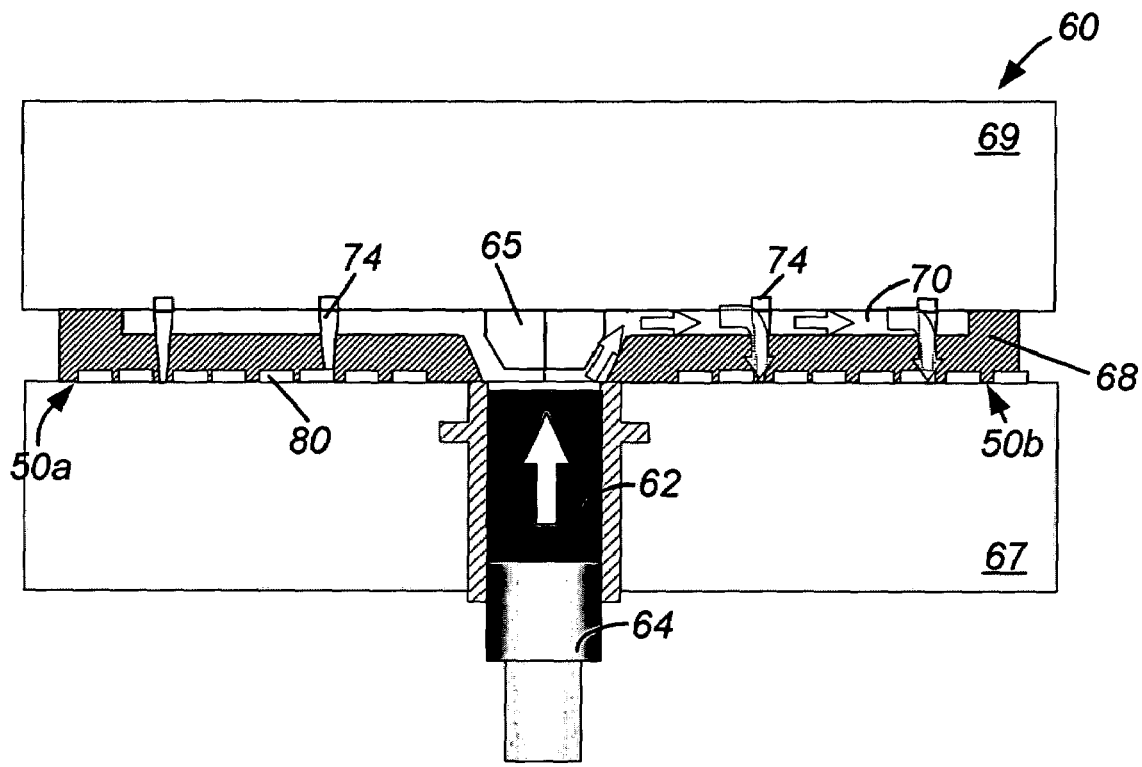
FIG. 7 is a simplified cross-sectional view of a portion of an injection molding tool 60 that can be used to package ICs according to the method of the present invention.

Embodiments of the invention use injection molding techniques instead of transfer molding to encapsulate integrated circuit packages. Injection molding pressurizes the flow of encapsulant allowing the encapsulant to flow into cavities faster and more completely than transfer molding. In order to better appreciate and understand embodiments of the invention, reference is first made to FIG. 7, which is a simplified cross-sectional view of a portion of an injection molding tool 60 that can be used to package ICs according to the method of the present invention. As shown in FIG. 7, two separate lead frame strips 50a and 50b are positioned on the left and right halves of the injection molding tool, respectively. Strips 50a and 50b are positioned so the cross sectional view of the strips shown in FIG. 7 is perpendicular to the length of the strips (direction X in FIG. 6).

Each lead frame strip 50a, 50b is placed between bottom and top plates 67, 69 of a mold. The mold also includes a middle plate 68 such that the middle and bottom plates combine to form cavities 80 around each individual package and a tight seal on the bottom surface of the packages to prevent flashing. Top plate 69 is positioned over middle plate 68 and helps direct the flow of encapsulant material through various runners and gates as described in detail below.

Figure 8:
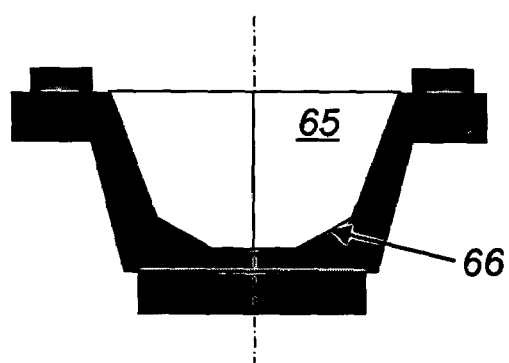
FIG. 8 is a simplified cross-sectional view of a new and novel design for a cull insert 66 according to one embodiment of the invention.

A suitable epoxy resin or similar encapsulant material 62 is placed above a plunger 64. Material 62 is heated to temperature that melts material 62 into a viscous state thus enabling the material to flow through the runners and gates described in detail below and into the package cavities 80 that define the shape of the IC packages. Once material 62 is heated to an appropriate temperature, plunger 64 is advanced toward the leadframe pushing or injecting the material into a series of runners. In the embodiment shown in FIG. 7, a cull insert 65, which is attached to a lower surface of top plate 69, directs encapsulant material towards each of the lead frame strips 50a and 50b. According to one embodiment, cull insert 65 includes a chamfered surface 66 (shown in FIG. 8) to improve the flow of encapsulant material into left and right runners that direct the encapsulant material to each of lead frame strips 50a and 50b on opposite sides of tool 60. In some embodiments surface 66 is angled at between 5–20 degrees from the bottom surface of insert 65, and in one specific embodiment surface 66 is angled at 10 degrees from the bottom surface of insert 65.

Figure 9:
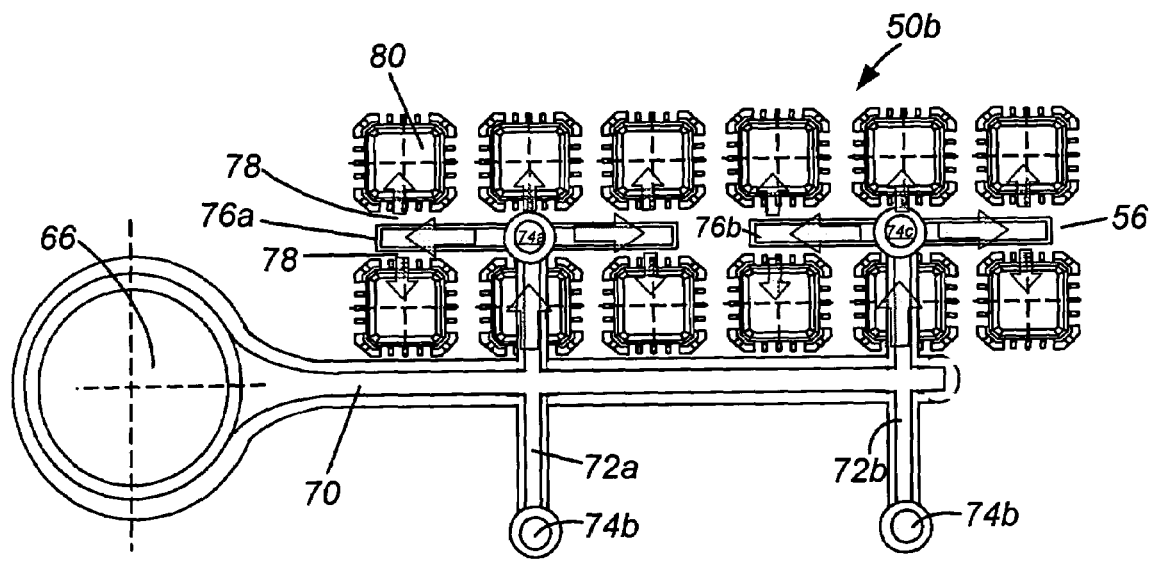
FIG. 9 is a simplified top plan view of a portion of lead frame strip 50b shown in FIG. 7 along with various runners and gates that deliver encapsulant to package cavities according to one embodiment of the invention.

Referring now to FIG. 9, which is a simplified top plan view showing a portion of lead frame strip 50b (the portion fluidly coupled to a single runner extending from cull insert 65), the flow of encapsulant through certain runners into the package cavities is shown by appropriate arrows. Specifically, after being split by cull insert 65, the encapsulation material travels along a main runner 70 into subrunners 72a and 72b, which as shown in FIG. 7, are defined by channels in an upper surface middle plate 68 and positioned in a plane above the lead frame strip and above package cavities 80 and thus do not take up valuable space on the lead frame strip. From each subrunner 72a, 72b the encapsulant flows into a vertical gate 74 formed in middle plate 68 (vertical gates 74a, 74b are coupled to subrunner 72a and vertical gates 74c, 74d are coupled to subrunner 72b) that directs the encapsulant downwards into a lead frame runner 76 that is defined by channels in a lower surface of middle plate 68. Vertical gate 74a is coupled to a lead frame runner 76a and vertical gate 76c is coupled to a lead frame runner 76b. Each of the lead frame runners is positioned along the length of and directly on top of one of the vertical connecting bars, such as bar 56 shown in FIG. 6. In some embodiments, the channels formed in middle plate 68 that define the various runners and vertical gates which deliver encapsulant to each cavity are lined with a thin liner material so that encapsulant that cools and hardens in the channels after the cavities are filled can be easily removed.

Figure 1:
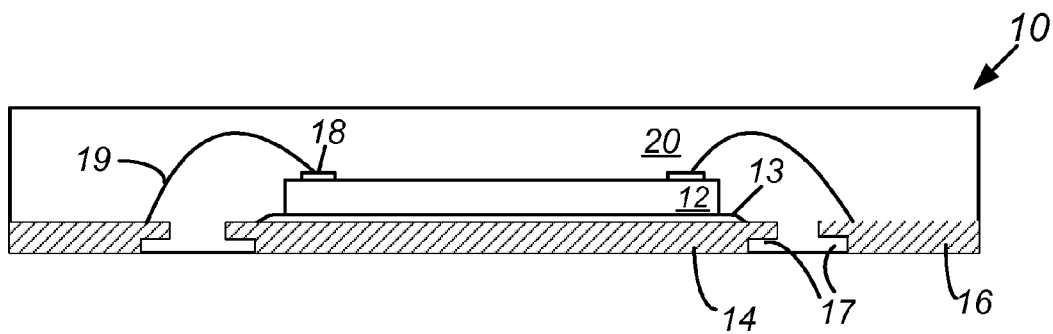
FIG. 1 is a simplified cross sectional view of an MLP package 10 that can be formed according to the techniques of the present invention.
Figure 2:
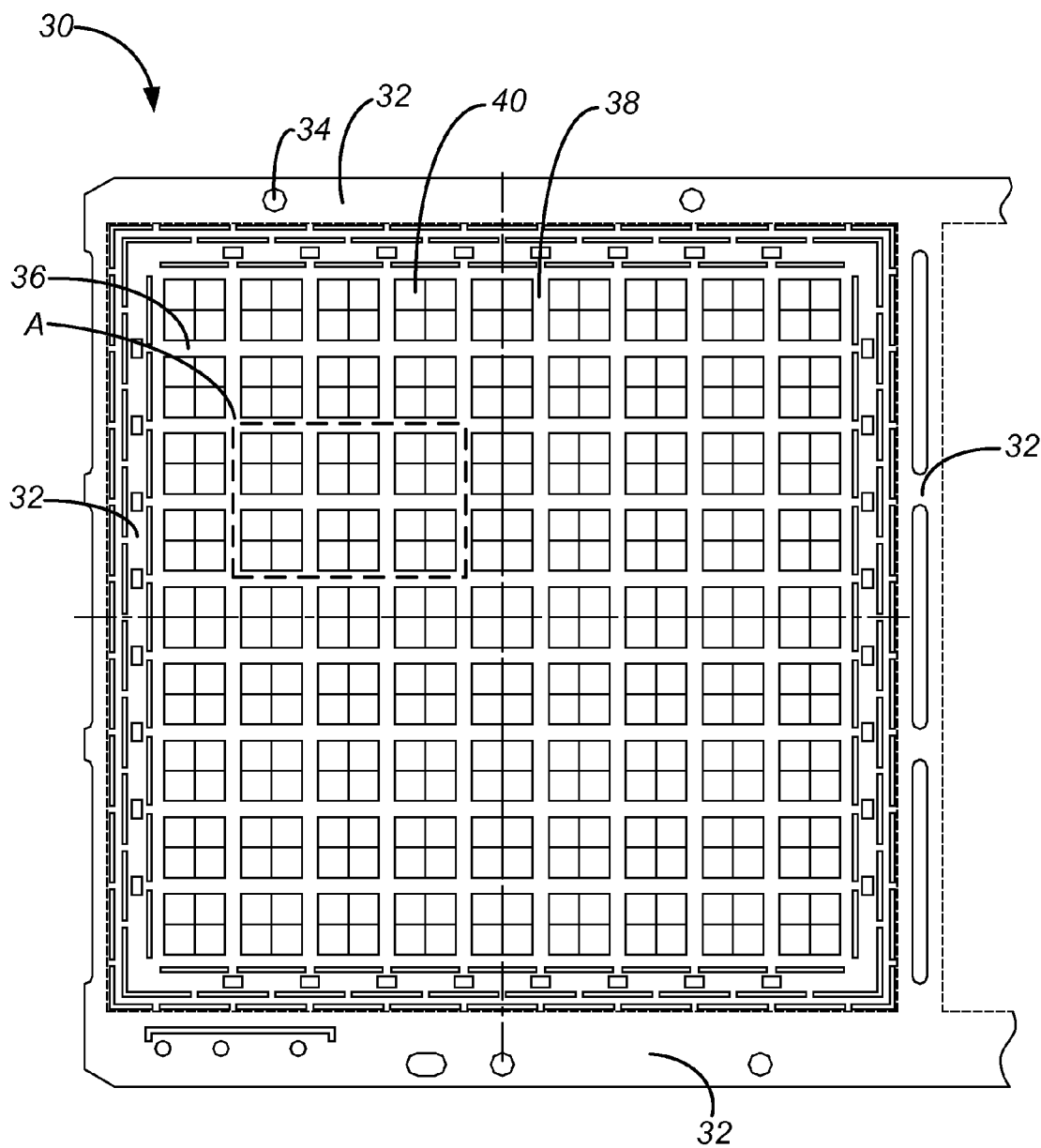
FIG. 2 is a simplified top plan view of a portion of a lead frame strip 30 that is used for a previously known block encapsulation process.
Figure 3:
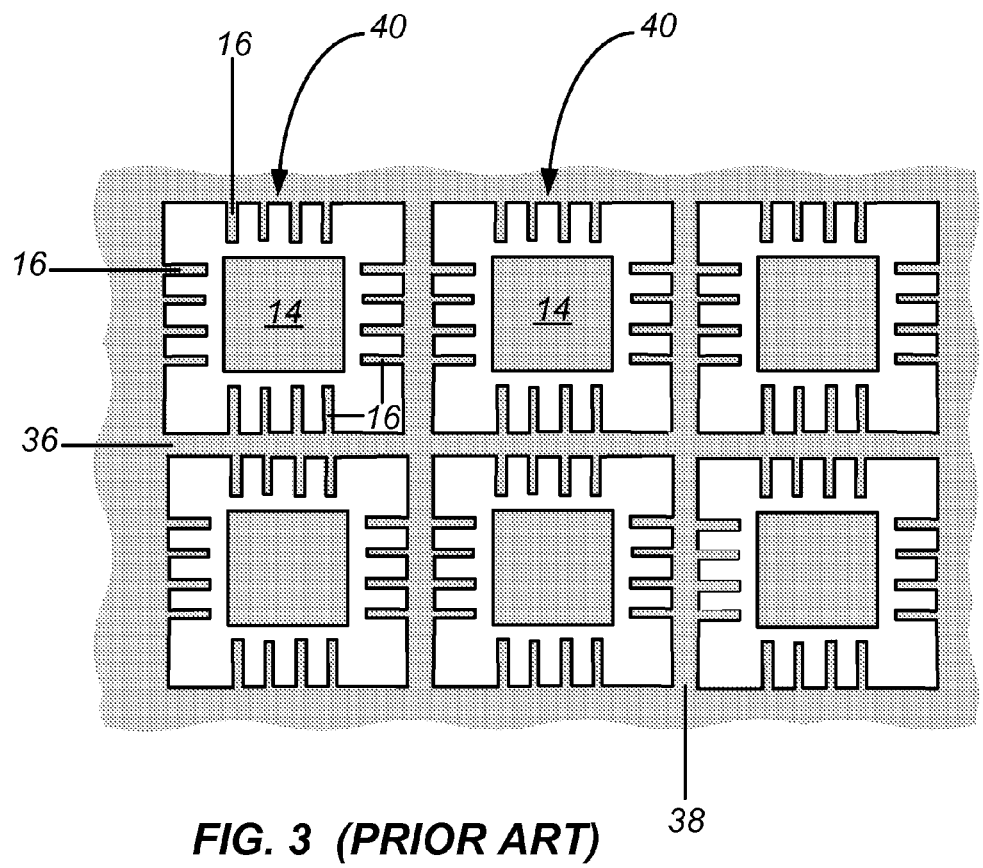
FIG. 3 is a simplified exploded view of portion A of lead frame strip 30 shown in FIG. 2.
Figure 4:
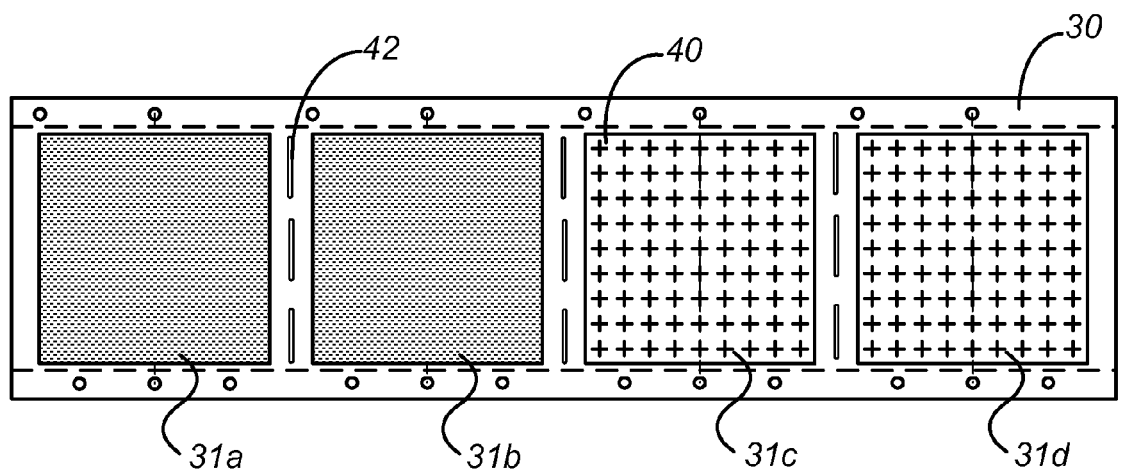
FIG. 4 is a simplified top plan view of a lead frame strip 30 used for a previously known block encapsulation process.
Figure 5:
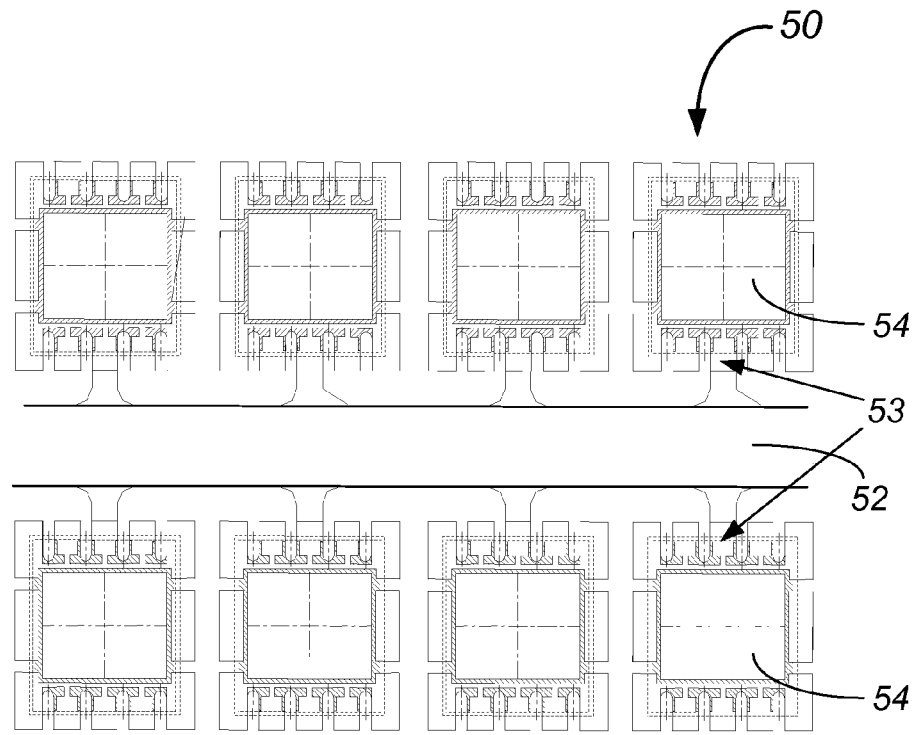
FIG. 5 is a simplified top plan view of a portion of a lead frame strip 50 having a runner positioned along one of the vertical connecting bars of the lead frame strip according to a previously known transfer molding technique.
Figure 10:
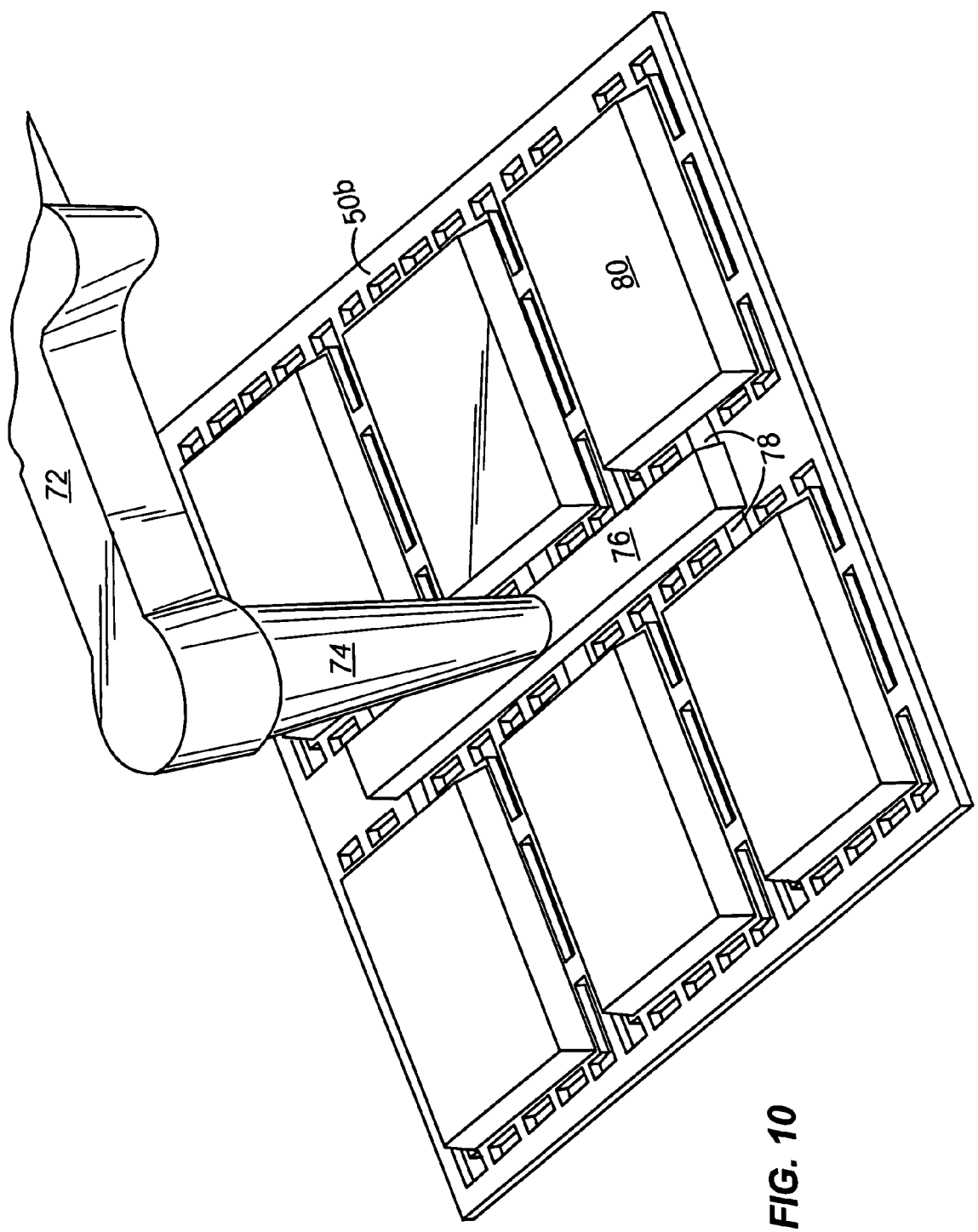
FIG. 10 is a perspective view of a portion of the runner/gate system shown in FIG. 9.

As described below, embodiments of the invention provide for lead frame runners that are thinner than previously known runners 52 (FIG. 5) thus allowing the vertical connecting bars of lead frame strips 50a and 50b spaced for lead frame runners to be thinner than connecting bar 56. Further details of the runner/gate system discussed with respect to FIG. 9 can be seen in FIG. 10, which is a perspective view of a portion of the runner/gate system shown in FIG. 9.

Figure 11:
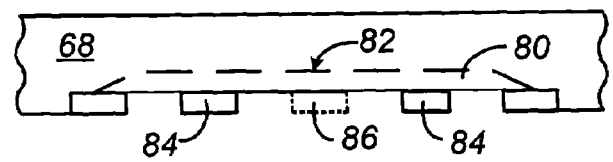
FIG. 11 is a simplified cross-sectional view of a mold for encasing an integrated circuit according to one embodiment of the present invention.
Figure 11:
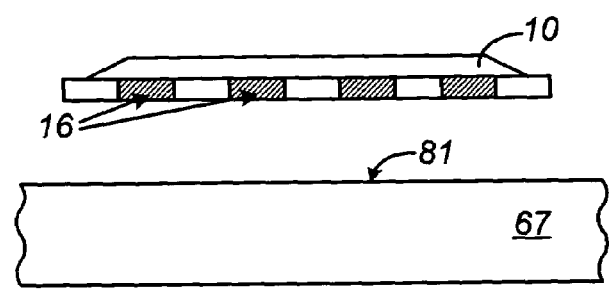

Referring now to FIG. 11, each individual IC is encased in a cavity 80 that includes a lower surface 81 defined by plate 67 and an upper surface 82 defined by plate 68 (see also FIG. 7). Projections 84 extend from plate 68 towards plate 67 to fill the space between adjacent leads of the package. Also, on the side of the package facing the lead frame runner, an inlet 86 (which is one embodiment is the absence of a projection 84) is aligned to be coupled to a cavity gate 78 (shown in FIG. 9 in abstract form only) that couples package cavity 80 to the lead frame runner. Cavity gate 78 is positioned just below the lead frame runner between adjacent leads of an individual IC package and has a vertical dimension thickness that is less than the thickness of the lead frame strip, a length from leadframe runner 76 to inlet 86, and a width approximately equal to the distance between the adjacent leads. The sides of cavity gate 78 are defined by adjacent lead frame leads, the bottom by the top of bottom plate 67 and the top by the bottom of middle plate 68. In one embodiment, the bottom of middle plate 67 includes a very thin projection that extends into the space between the adjacent leads to help ensure a tight seal around the cavity gate while encapsulant is introduced into the package cavity.

According to embodiments of the invention, much of the encapsulant delivery path is through runners positioned considerably above the lead frame strip and above the package cavities. Encapsulant is not delivered downward to the lead frame strip until it reaches a vertical gate that connects to a lead frame runner 76. There are then multiple lead frame runners along a particular column or row of the lead frame so that any individual lead frame runner does not serve the entire length of the column or row. Each lead frame runner delivers encapsulant material to multiple cavities (e.g., two, four, six, eight, ten or more cavities) on either side of the connecting bar the runner is positioned along. This approach allows the lead frame runners to be thinner than lead frame runners 52 shown in FIG. 5 according to previously known techniques because less encapsulant is required to flow through the lead frame runner thereby saving space on the lead frame strip and allowing more IC packages to be formed per unit area of lead frame strip than previously possible.

In the example shown in FIG. 9, main runner 70 delivers encapsulant to 24 cavities 80 (only twelve of which are shown, a person of skill in the art will appreciate that there are also twelve IC package forming areas below main runner 80 that mirror the package forming areas shown above runner 80), each subrunner 72a, 72b delivers encapsulant to 12 cavities and each lead frame runner delivers encapsulant to 6 cavities. Also, there is a single vertical gate 74 that corresponds to each lead frame runner 76. A skilled artisan will also appreciate that additional main runners 80 are used to deliver encapulant material to other portions of lead frame strip 90 not shown in FIG. 9 and that each such main runner is coupled to receive encapsulant forced against a cull insert via a plunger similar to plunger 64 shown in FIG. 7.

Figure 12A:
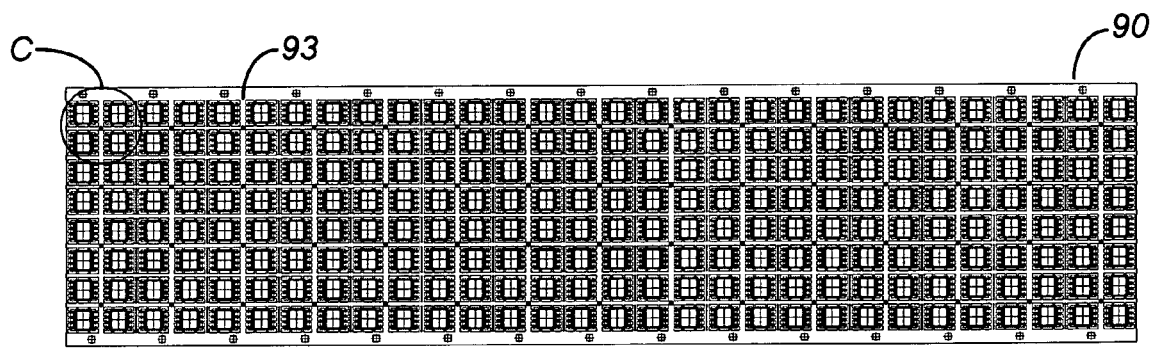
FIGS. 12A and 12B are top views of a lead frame strip according to one embodiment of the present invention.
Figure 12B:
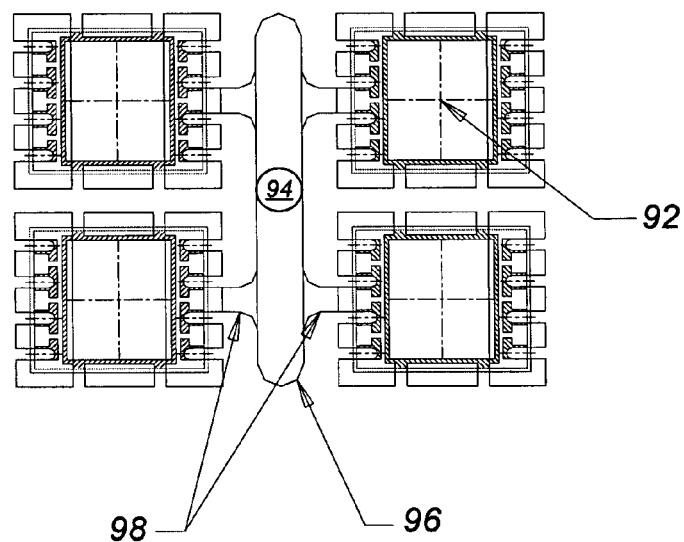

Referring now to FIG. 12A which illustrates an example of a lead frame strip 90 according to one embodiment of the invention. As shown in FIG. 12A, lead frame strip 90 includes 8 rows by 30 columns of IC packages for a total of 240 packages on the lead frame strip. Every second vertical connecting bar 93 includes a vertical gate 94 that delivers encapsulant material to a lead frame runner 96 (shown in FIG. 12A as small dots and shown in FIG. 12B, which is an exploded view of portion C of FIG. 12A, as a circle within lead frame runner 96) that in turn delivers encapsulant to IC package cavities on each side of the lead frame runner via a gate 98. As shown in FIG. 12B, each lead frame runner 96 services four separate cavities 92 via four respective gates 98. Also, there are four distinct lead frame runners 96 (not shown) along the length of every second vertical connecting bar 93.

The description above has been given to help illustrate the principles of this invention. It is not intended to limit the scope of this invention in any way. A large variety of variants are apparent, which are encompassed within the scope of this invention. For example, based on the above description, a person of skill in the art will appreciate that embodiments of the invention are not limited to MLP packages and instead can be used with other types of chip scale packages including packages in which the bottom surface of the leadframe is covered with encapsulant, chip-on-lead and other packages that do not include a die pad. Also, while the invention has been described in detail and with reference to specific examples thereof, it will be apparent to one skilled in the art that various changes and modifications can be made therein without departing from the spirit and scope thereof. One such example is that in some embodiments of the invention, a cascaded lead frame can be used in the injection molding process where a single lead frame runner delivers encapsulant material to two or more columns of IC packages on each side of the lead frame runner. In such embodiments, an additional gate is included between the IC package cavities directly adjacent the lead frame runner and IC package cavities that are spaced more than one row away from the lead frame runner. These equivalents and alternatives are intended to be included within the scope of the present invention.

What is claimed is:

1. A method of encapsulating a plurality of integrated circuit chips attached to a lead frame strip, the lead frame strip including an outer frame and a plurality of vertical and horizontal connecting bars attached to the outer frame in a manner defining a plurality of inner frames arranged in a matrix pattern within the outer frame, each inner frame including an area where an IC chip from the plurality of IC chips is attached, the method comprising:
for each inner frame, encasing the IC chip attached to the inner frame along with a portion of the inner frame within a package cavity of a mold sized to form a single integrated circuit package;
injecting encapsulant material into each package cavity, wherein the encapsulant material is delivered to the package cavity through a series of runners and gates that includes at least one runner positioned on a plane above the package cavity, a lead frame runner positioned along a first connecting bar of the lead frame strip and a vertical gate that couples a runner positioned on a plane above the package cavity to the lead frame runner and wherein each lead frame runner delivers encapsulant material to a plurality of package cavities positioned adjacent to the lead frame runner.

2. The method of encapsulating a plurality of integrated circuit chips attached to a lead frame strip set forth in claim 1 wherein each inner frame includes a die pad, and the IC chip attached to the inner frame is attached to the die pad.

3. The method of encapsulating a plurality of integrated circuit chips attached to a lead frame strip set forth in claim 1 wherein the IC chip attached to the inner frame is attached to ends of a plurality of leads associated with the inner frame.

4. A method of encapsulating a plurality of integrated circuit chips attached to a lead frame strip, the lead frame strip including an outer frame and a plurality of vertical and horizontal connecting bars attached to the outer frame in a manner defining a plurality of inner frames arranged in a matrix pattern within the outer frame, each inner frame including an area where an IC chip from the plurality of IC chips is attached, the method comprising:
for each inner frame, encasing the IC chip attached to the inner frame along with a portion of the inner frame within a package cavity of a mold sized to form a single integrated circuit package;
injecting encapsulant material into each package cavity, wherein the encapsulant material is delivered to the package cavity through a series of runners and gates that includes at least one runner positioned on a plane above the package cavity, a lead frame runner positioned along a first connecting bar of the lead frame strip and a vertical gate that couples a runner positioned on a plane above the package cavity to the lead frame runner and wherein each lead frame runner delivers encapsulant material to a plurality of package cavities positioned adjacent to the lead frame runner;
wherein, along a length of each and every second vertical connecting bar of the lead frame strip, a plurality of lead frame runners are positioned end to end.

5. The method of encapsulating a plurality of integrated circuit chips attached to a lead frame strip set forth in claim 4 wherein each lead frame runner in the plurality of lead frame runners is coupled to a vertical gate.

6. The method of encapsulating a plurality of integrated circuit chips attached to a lead frame strip set forth in claim 1 wherein a substantial portion of each lead frame runner is positioned directly on top of the lead frame strip and wherein the gate that delivers encapsulant material to each cavity is positioned between top and bottom surfaces of the lead frame strip.

7. A method of forming a plurality of integrated circuit packages, the method comprising:
providing a lead frame strip comprising an outer frame, a plurality of horizontal and vertical connecting bars attached to the outer frame and defining a plurality of inner frames arranged in a matrix pattern within the outer frame, each inner frame comprising a die pad and a plurality of leads arranged around the die pad;
for each of a first plurality of integrated circuit die, attaching an integrated circuit die in the first plurality of integrated circuit die to a unique die pad and electrically connecting the integrated circuit die to at least some of the plurality of leads surrounding its respective die pad;
for each attached integrated circuit die, encasing the integrated circuit die and at least a portion of the lead frame within a cavity of a mold, wherein each mold is sized to form a single integrated circuit package and includes an inlet, the inlet positioned between adjacent leads associated with the integrated circuit die and configured to allow encapsulating material to be introduced into the cavity;
for each cavity encasing an integrated circuit die, injecting encapsulant material into the cavity under pressure to encapsulate the integrated circuit die, wherein the encapsulant material flows through a runner positioned on a plane above the cavity, through a vertical gate to a lead frame runner positioned along a connecting bar of lead frame strip and into a plurality of cavities through a respective plurality of cavity gates coupled to the lead frame runner; and
after the encapsulant material hardens, singulating the plurality of integrated circuit packages using a punch singulation technique.

8. The method of packaging a plurality of integrated circuit die set forth in claim 7 wherein, along a length of each and every second vertical connecting bar of the lead frame strip, a plurality of lead frame runners are positioned end to end.

9. The method of encapsulating a plurality of integrated circuit chips attached to a lead frame strip set forth in claim 8 wherein each lead frame runner in the plurality of lead frame runners is coupled to a vertical gate.

10. The method of encapsulating a plurality of integrated circuit chips attached to a lead frame strip set forth in claim 7 wherein the step of injecting encapsulant material into the cavity of each mold encasing an integrated circuit further comprises delivering the encapsulant material through a main runner that serves a plurality of subrunners, each of which is positioned on a plane above the cavity.

11. The method of encapsulating a plurality of integrated circuit chips attached to a lead frame strip set forth in claim 10 wherein a substantial portion of each lead frame runner is positioned directly on top of the lead frame strip and wherein the gate that delivers encapsulant material to each cavity is positioned between top and bottom surfaces of the lead frame strip.

12. The method of encapsulating a plurality of integrated circuit chips attached to a lead frame strip set forth in claim 11 wherein each subrunner is coupled to one or more lead frame runners by a vertical gate.

13. The method of encapsulating a plurality of integrated circuit chips attached to a lead frame strip set forth in claim 12 wherein each subrunner is coupled to two lead frame runners positioned horizontally adjacent to each other on different vertical connecting bars, each of the two lead frame runners delivering encapsulant to different package cavities.

14. A method of encapsulating a plurality of IC chips attached to a lead frame strip, the method comprising:
providing a lead frame strip including an outer frame, at least first, second and third adjacent vertical connecting bars attached to the outer frame and a plurality of horizontal connecting bars attached to the outer frame, wherein the vertical and horizontal connecting bars define a plurality of inner frames arranged in a matrix pattern within the outer frame, each inner frame having an IC chip from the plurality of IC chips attached to it, the plurality of inner frames comprising a first plurality of inner frames and a second plurality of inner frames, each of the first and second plurality of inner frames including at least two inner frames positioned between the first and second vertical connecting bars and at least two inner frames positioned between the second and third vertical connecting bars;
encasing each of the plurality of inner frames and the IC chip attached to the respective inner frame within a package cavity of a mold sized to form a single integrated circuit package such that the first plurality of inner frames and associated IC chips is encased in a corresponding first plurality of molds and the second plurality of inner frames and associated IC chips is encased in a corresponding second plurality of molds;
injecting each package cavity in the first plurality of molds with encapsulant material, wherein the encapsulant material is delivered to each package cavity in the first plurality of molds through a series of runners and gates that includes a runner positioned on a plane above the package cavities, a first lead frame runner positioned along the second connecting bar of the lead frame strip and a vertical gate that delivers the encapsulant material from a runner on a plane above the lead frame strip to the first lead frame runner; and
injecting each package cavity in the second plurality of molds with encapsulant material, wherein the encapsulant material is delivered to each package cavity in the second plurality of molds through a series of runners and gates that includes a runner positioned on a plane above the package cavities, a second lead frame runner positioned along the second connecting bar of the lead frame strip and a vertical gate that delivers the encapsulant material from a runner on a plane above the lead frame strip to the second lead frame runner, wherein the first and second lead frame runners are positioned end-to-end along a length of the second connecting bar.

15. The method of encapsulating a plurality of IC chips attached to a lead frame strip set forth in claim 14 wherein the second vertical connecting bar is wider than each of the first and third vertical connecting bars.

16. The method of encapsulating a plurality of IC chips attached to a lead frame strip set forth in claim 15 wherein the series of runners and gates comprises a main runner, a first subrunner and a second subrunner all of which are on a plane above the package cavities, where the main runner delivers encapsulant material to both the first and second subrunners, and the first subrunner delivers encapsulant material to a first vertical gate associated with the first plurality of molds, and the second subrunner delivers encapsulant material to a second vertical gate associated with the second plurality of molds.

17. The method of encapsulating a plurality of IC chips attached to a lead frame strip set forth in claim 16 wherein the lead frame strip comprises fourth and fifth vertical connecting bars adjacent to the third vertical connecting bar, the second and fourth vertical connecting bars have a substantially identical width and the first, third and fifth vertical connecting bars have a substantially identical width; and
the plurality of inner frames further comprises a third plurality of inner frames and a fourth plurality of inner frames, each of the third and fourth plurality of inner frames including at least two inner frames positioned between the third and fourth vertical connecting bars and at least two inner frames positioned between the fourth and fifth vertical connecting bars; and the method farther comprises
injecting each package cavity in the third plurality of molds with encapsulant material, wherein the encapsulant material is delivered to each package cavity in the third plurality of molds through a series of runners and gates that includes a runner positioned on a plane above the package cavities, a third lead frame runner positioned along the fourth connecting bar of the lead frame strip and a vertical gate that delivers the encapsulant material from a runner on a plane above the lead frame strip to the third lead frame runner; and
injecting each package cavity in the fourth plurality of molds with encapsulant material, wherein the encapsulant material is delivered to each package cavity in the fourth plurality of molds through a series of runners and gates that includes a runner positioned on a plane above the package cavities, a fourth lead frame runner positioned along the fourth connecting bar of the lead frame strip and a vertical gate that delivers the encapsulant material from a runner on a plane above the lead frame strip to the fourth lead frame runner, wherein the third and fourth lead frame runners are positioned end-to-end along a length of the fourth connecting bar.

18. The method of encapsulating a plurality of IC chips attached to a lead frame strip set forth in claim 17 wherein the first and second lead frame runners are positioned horizontally adjacent to the third and fourth lead frame runners.

19. A method of encapsulating a first plurality of integrated circuit chips attached to first lead frame strip and a second plurality of integrated circuit chips attached to a second lead frame strip, each of the first and second lead frame strips including an outer frame and a plurality of vertical and horizontal connecting bars attached to the outer frame in a manner defining a plurality of inner frames arranged in a matrix pattern within the outer frame, each inner frame including an area where an IC chip from the plurality of IC chips is attached, the method comprising:

for each inner frame, encasing the IC chip attached to the inner frame along with a portion of the inner frame within a package cavity sized to form a single integrated circuit package;

injecting encapsulant material into each package cavity, wherein the encapsulant material is delivered to the package cavity through a series of runners and gates that includes a first series of runners positioned over package cavities on the first lead frame strip, a second series of runners positioned over package cavities on the second lead frame strip, a first lead frame runner positioned along a first connecting bar of the first lead frame strip and a first vertical gate that couples a runner in the first series of runners to the first lead frame runner, a second lead frame runner positioned along a second connecting bar of the second lead frame strip and a second vertical gate that couples a runner in the second series of runners to the second lead frame runner, and wherein each of the first and second lead frame runners delivers encapsulant material to a plurality of package cavities positioned adjacent to the respective lead frame runner.

20. A method of encapsulating a first plurality of integrated circuit chips attached to first lead frame strip and a second plurality of integrated circuit chips attached to a second lead frame strip, each of the first and second lead frame strips including an outer frame and a plurality of vertical and horizontal connecting bars attached to the outer frame in a manner defining a plurality of inner frames arranged in a matrix pattern within the outer frame, each inner frame including an area where an IC chip from the plurality of IC chips is attached, the method comprising:

for each inner frame, encasing the IC chip attached to the inner frame along with a portion of the inner frame within a package cavity sized to form a single integrated circuit package;

injecting encapsulant material into each package cavity, wherein the encapsulant material is delivered to the package cavity through a series of runners and gates that includes a first series of runners positioned over package cavities on the first lead frame strip, a second series of runners positioned over package cavities on the second lead frame strip, a first lead frame runner positioned along a first connecting bar of the first lead frame strip and a first vertical gate that couples a runner in the first series of runners to the first lead frame runner, a second lead frame runner positioned along a second connecting bar of the second lead frame strip and a second vertical gate that couples a runner in the second series of runners to the second lead frame runner, and wherein each of the first and second lead frame runners delivers encapsulant material to a plurality of package cavities positioned adjacent to the respective lead frame runner;

wherein the injecting step further includes dividing a flow of encapsulant material into a first flow that flows into the first series of runners and a second flow that flows into the second series of runners with a cull insert that has a bottom surface and an annular side surface.

21. The method of encapsulating a first and second plurality of integrated circuit chips set forth in claim 20 wherein the annular side surface of the cull insert is chamfered to form a lower side surface and an upper side surface, the lower side surface projecting from the bottom surface at an angle of between 5–20 degrees.

* * * * *